United States Patent [19]

Ringleb et al.

[11] Patent Number: 5,032,788

[45] Date of Patent: * Jul. 16, 1991

[54] TEST CELL FOR NON-CONTACT OPENS/SHORTS TESTING OF ELECTRICAL CIRCUITS

[75] Inventors: Diethelm G. Ringleb, Andover; Andrew J. LePage, Lowell, both of Mass.

[73] Assignee: Digital Equipment Corp., Maynard, Mass.

[*] Notice: The portion of the term of this patent subsequent to Nov. 13, 2007 has been disclaimed.

[21] Appl. No.: 371,704

[22] Filed: Jun. 26, 1989

[51] Int. Cl.$^5$ .............................................. G01R 31/02
[52] U.S. Cl. ............................ 324/158 F; 324/158 R; 324/501
[58] Field of Search ........... 324/158 E, 158 P, 158 R, 324/73 PC, 501; 141/349, 348, 350

[56] References Cited

U.S. PATENT DOCUMENTS

| | | | |
|---|---|---|---|
| 3,436,651 | 4/1969 | Helms et al. | 324/96 |
| 3,710,251 | 1/1973 | Hagge et al. | 324/158 F |
| 4,507,605 | 3/1985 | Geisel | 324/73 PC |
| 4,520,312 | 5/1985 | Tarng et al. | 324/158 F |
| 4,527,119 | 7/1985 | Rogers et al. | 324/158 F |
| 4,573,756 | 3/1986 | Smith et al. | 324/158 F |
| 4,721,910 | 1/1988 | Bokok et al. | 324/158 D |
| 4,771,230 | 9/1988 | Zeh | 324/158 F |
| 4,839,586 | 6/1989 | Musseau et al. | 324/158 F |
| 4,932,393 | 6/1990 | Sim | 141/349 |

Primary Examiner—Reinhard J. Eisenzopf
Assistant Examiner—Edward Urban
Attorney, Agent, or Firm—Cesari and McKenna

[57] ABSTRACT

A test cell for non-contact testing a circuit board for shorts and opens includes a hermetically sealable container for that circuit board, at least one wall of the container providing access to permit a circuit board to be positioned at an imaging plane inside the container. A pair of planar electrodes positioned inside the container are spaced on opposite sides of and parallel to the imaging plane and these electrodes are connected to contacts on the exterior of the container so that the electrodes can be releasably connected to an external voltage source to provide an electric field inside the container which extends perpendicular to the imaging plane. One of these electrodes and the container wall adjacent thereto are transparent to light from a pulsed laser positioned outside the container which is arranged to image a selected spot on a conductor of a circuit positioned at the imaging plane. One or more valved gas fittings are mounted to the outside of the container so that the container can be releasably connected to external gas conduits to fill the container with an inert gas. Also a sensor may be provided inside the container to sense the gas pressure in the container.

11 Claims, 2 Drawing Sheets

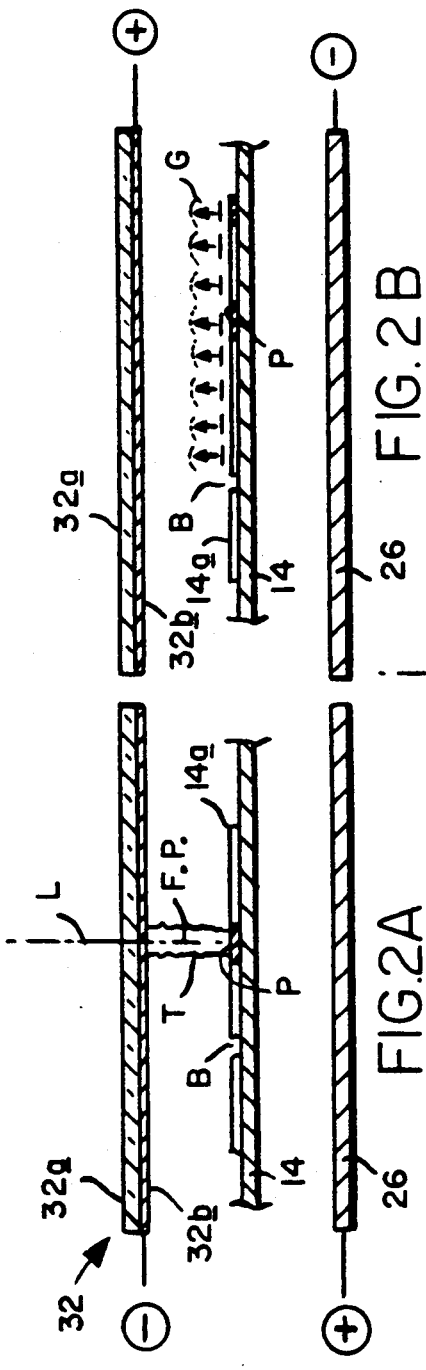
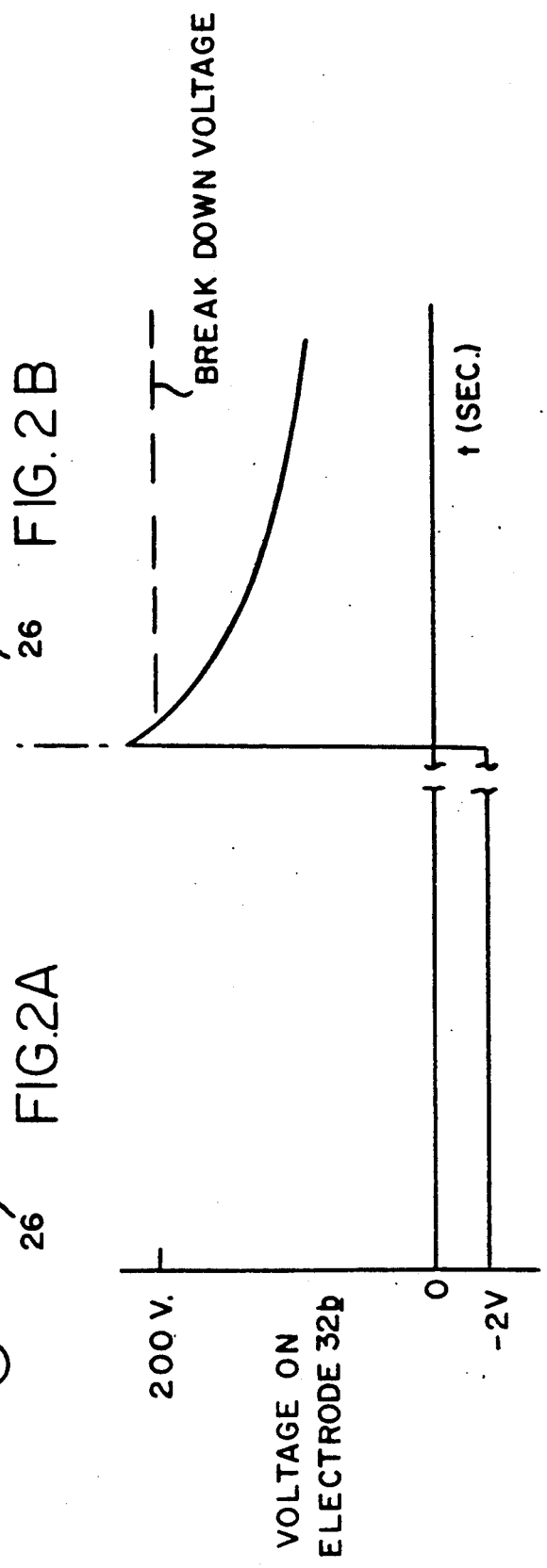

TEST CELL FOR NON-CONTACT OPENS/SHORTS TESTING OF ELECTRICAL CIRCUITS

This invention relates to apparatus for testing electrical conductor continuity and isolation (i.e. shorts and opens) in circuit boards, such as printed wiring boards, printed circuits, and the like. It relates more particularly to a test cell for contactless testing for opens and shorts using a laser-induced plasma.

BACKGROUND OF THE INVENTION

The usual printed wiring boards, ceramic substrates, printed circuits and the like include a multiplicity of conductive paths or lines of etch which are connected selectively and which lie in relatively complex patterns on a non-conductive rigid or flexible substrate. Prior to connecting the various IC chips, resistors, capacitors, etc. to the circuit, it is desirable to test the electrical conductors of the circuit so that circuit faults such as opens and shorts can be discovered and corrected before those circuit components are added to the board or circuit.

It has long been the practice to test such circuits by placing the circuit in a fixture and bringing "bed of nails" test probes into contact with the various circuit conductors or lines of etch. Once in contact, the continuity between various probes is measured using well known electrical instrumentation. However, as the packing densities of such circuits have increased over the years, the conductor widths and pad sizes have decreased commensurately. Resultantly, it has become more and more difficult to use such mechanical means because of the need for finer and finer probes and more accurate motion systems for positioning the probes relative to the circuit being tested. In addition, there is a greater propensity for damaging finer conductors and probes during the test.

To meet these more stringent testing requirements, various techniques have been developed to reduce or eliminate entirely physical contact with the circuits during the performing of such tests. One known technique uses an electron beam. One end of a conductor in the circuit is bombarded by an electron beam and brought to a predetermined potential by secondary electron emission so that between the two ends of the conductor, there is a potential difference resulting in current flow along the conductor provided there is no break in the conductor. The prior art is replete with testing systems using this principle which provide clear discrimination between uninterrupted and interrupted conductors as well as detection of shorted conductors in printed wiring boards, circuits, VLSI packaging substrates and other microcircuitry. However, contactless testing using an electron beam does have some disadvantages. Some such systems require individually controlled electron beams which must simultaneously address both ends of the conductor under test. Some electron beam test systems require relatively complex masks which make difficult the loading and unloading of specimens.

There is also a known non-contact method of testing electrical conductors in which a single mechanical probe stimulates a conductor of a circuit placed in a low pressure inert atmosphere. This stimulation causes the conductor and all the lines and runs connected electrically to it to glow. This glow is then observed using a scanning photometer. In this way, an entire network can be checked with the use of a single mechanical probe thereby minimizing the contact between the probe and the circuit under test. This prior testing technique is disadvantaged in that it does require at least some physical contact between the test instrument and the circuit under test.

There is also a known prior fault testing technique using a laser for achieving an electrical connection between a probe and a circuit under test without there being any physical contact between the probe and the circuit conductors. In this arrangement, a laser produces a plasma that electrically connects the probe positioned above the circuit under test to the underlying circuit conductor. However, a mechanical connection is still needed to electrically connect the plasma "probe" to the necessary instrumentation to determine whether or not there is a circuit fault.

SUMMARY OF THE INVENTION

Bearing in mind the deficiencies of the prior art as described above, the present invention relates to improved apparatus for non-contact testing for open circuits and short circuits in circuit boards, wiring boards, ceramic substrates, electrical networks and the like.

The test apparatus allows testing to be performed outside clean room conditions and it permits testing to be performed relatively efficiently and at minimum cost without damage to the circuit under test due to physical contact.

The invention, accordingly, comprises the features of construction, combination of elements and arrangement of parts which will be exemplified in the following detailed description, and the scope of the invention will be indicated in the claims.

Briefly, in accordance with this invention, the circuit to be tested is positioned in an inert gas atmosphere between a pair of electrodes extending generally parallel to the plane of the circuit. The electrode opposite the circuit conductors is transparent to light from a pulsed laser positioned opposite the transparent electrode. The actual testing of the circuit may be performed in two phases, namely, a charge phase and a discharge phase. During charging, a potential difference of a few volts may be established between the electrodes, with the transparent electrode carrying the negative charge. Then the laser is preferably pulsed briefly with the laser beam coming into focus between the transparent electrode and a selected spot on the circuit conductor or line of etch to be tested. The gas at the focus of the beam ionizes as a result of multiphoton absorption and, desirably also, a cascade effect. Resultantly, a plasma forms at the focus, and under the influence of the applied electric field, diffuses to electrically connect the transparent electrode and the selected spot on the circuit conductor. A current then flows briefly to the conductor thus imparting an electric charge to all conductor runs connected electrically to the conductor spot imaged by the laser. Conductor portions that do not have continuity with that spot will not be so charged. This plasma may persist for a few microseconds after cessation of the laser pulse.

As soon as the laser pulse has ended, the apparatus may be switched to its discharge phase. For this, the polarity of the voltage applied to the electrodes is reversed and the voltage increased to the breakdown voltage of the inert gas surrounding the circuit under test. Once the breakdown voltage is reached, a discharge plasma forms along the previously charged portions or runs of the conductor as a result of electrons jumping from the charged portions of the conductor and exciting the inert gas above those portions. Resultantly, all of the conductor runs of the circuit connected electrically to the conductor spot that was imaged by the laser beam emit light or glow due to electroluminescence. Thus, by observing which circuit conductor runs emit light, one can determine whether or not those runs are connected electrically to the conductor spot exposed to the laser beam.

The discharge glow can be detected automatically by a camera, photometer or other conventional light detecting device. Also, selected points on the circuit can be sampled using a scanning photometer, for example, to determine whether or not those points emit light. These test results can then be compared to a reference sample representing the desired continuity condition for that circuit. If there is a match, then the circuit may be deemed to pass the test. If there is no match, the circuit can be said to fail the test. The particular point or points where the mismatch occurs indicates the location and type of failure, i.e. an open circuit or short circuit.

If as is usually the case, a particular circuit board contains several independent or isolated circuit paths or runs, then each individual path or run may be charged and discharged as described above to fully test the circuit.

An important part of this overall apparatus is the test cell or module in which the circuit is placed when being tested. This test cell is basically a shallow container or box having an electrically conductive bottom wall and electrically non-conductive side walls and a top wall, one of the walls being movable to allow access to the interior of the container. The container top wall is transparent and also electrically conductive. For two-sided test applications, the container bottom wall would also be transparent as well as electrically conductive. More particularly, the top wall and/or bottom wall may comprise a sheet of transparent material such as glass which is provided on its interior surface with an electrode which is also transparent. Means are provided inside the container for supporting a circuit, ceramic substrate or the like so that the circuit or substrate is substantially parallel to the container bottom wall as well as to the container top wall. Appropriate seals may be provided at the boundary of the movable wall and the remaining container walls to effect a fluid-tight seal when the movable wall is in its closed position.

Appropriate external valved gas fittings may be provided in a wall of the container to allow the cell to be releasably connected to external plumbing to enable the cell to be purged of air and filled with an inert gas while apart from the remainder of the apparatus. Also, exterior electrical contacts or connectors may be mounted to a wall of the cell and connected electrically to the conductive surfaces of the container top and bottom walls to enable those surfaces to be releasably connected to an external source of potential. Preferably also, means are provided in the container for sensing the pressure of the inert gas inside the cell and for applying that data to an external pressure control.

Once loaded with a circuit, the test cell is arranged to be positioned on a support directly opposite the laser and light detector so that the various conductive paths of the circuit being tested can be imaged by the laser and viewed by the detector. When the cell is in the proper position on its support, connections may be made automatically between the gas fittings on the cell and mating fittings on the support to connect the cell to a gas source and drain and between the electrical contacts and mating contacts on the support for connecting the cell electrodes to a potential source and, if applicable, to connect the pressure sensor in the cell to external means for controlling the gas pressure inside the cell during a test.

A test cell such as this produces several distinct benefits. The cell is simple to make and is interchangeable. The cell is also relatively inexpensive so that several can be kept on hand. While one circuit is being tested in one cell, others can be prepared for testing in other cells. This increases tester throughput and decreases overall circuit testing costs since the expensive parts of the tester, e.g. the laser, light detector and ancillary equipment will not be tied up with the preparation of the circuits for the test. In addition, the circuit under test will be isolated in the test cell thus giving the option of having the tester as a whole located outside expensive and sometimes limited clean room facilities.

Accordingly, this non-contact test cell should find wide application wherever it is necessary to test the conductor runs of circuits, printed wiring boards and the like for opens and shorts.

BRIEF DESCRIPTION OF THE DRAWINGS

In the accompanying drawings:

FIGS. 2A and 2B are sectional views taken along line 2—2 of FIG. 1 illustrating the operation of the apparatus; and FIGS. 3A and 3B are diagrammatic views that help to explain the operation of the FIG. 1 apparatus.

DESCRIPTION OF THE PREFERRED EMBODIMENT

Figure 1:
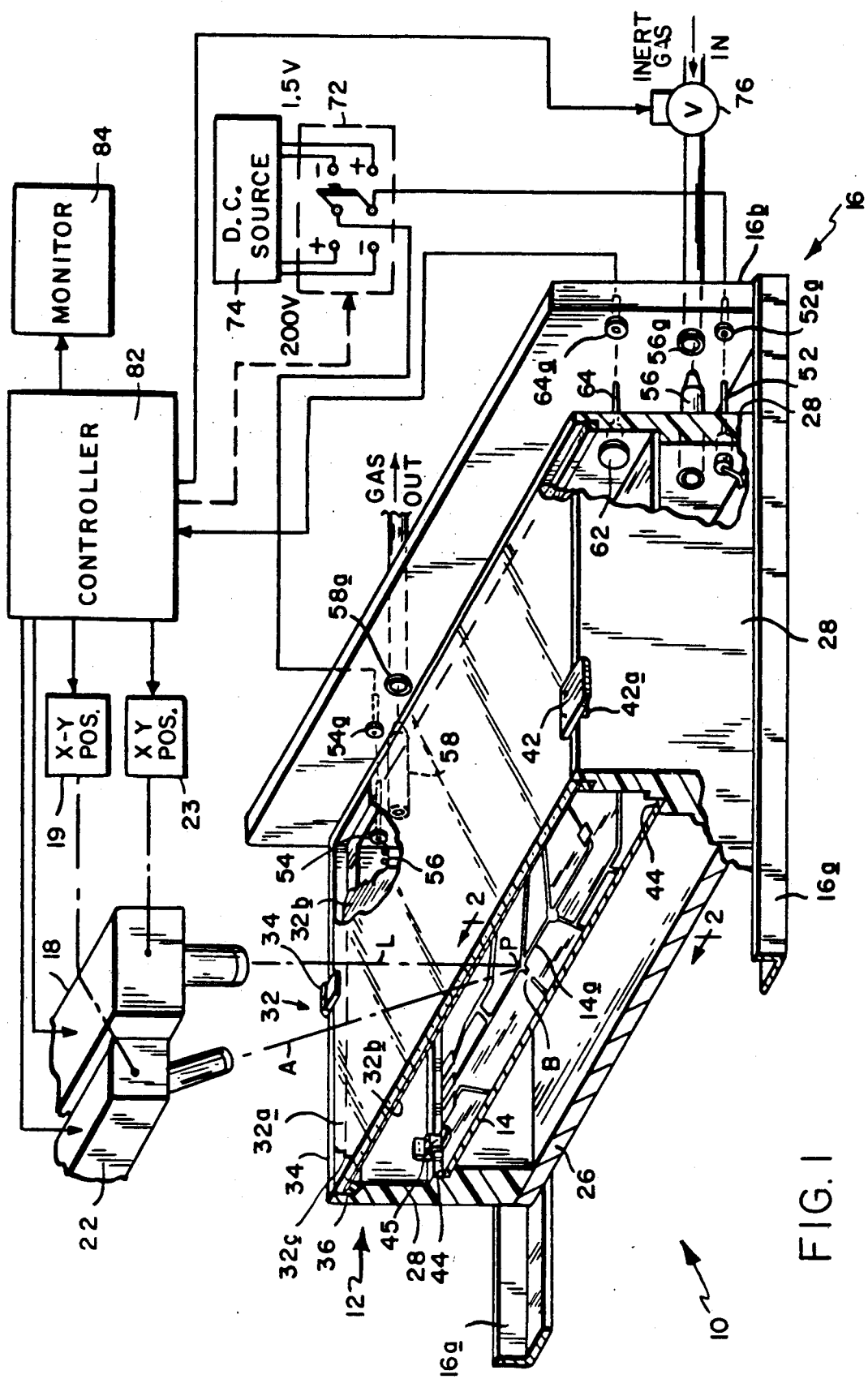
FIG. 1 is a diagrammatic view with parts broken away showing apparatus for non-contact testing according to this invention.

Referring to FIG. 1 of the drawings, the apparatus, shown generally at 10, includes a fluid-tight test cell 12 for housing a circuit board or circuit 14 to be tested. Cell 12 is positioned directly opposite the working end of a laser 18 which may be supported by a suitable XY positioning device 23 so that the laser can direct a coherent beam of light L to selected points or spots P on the conductors or lines of etch 14a of the circuit 14 in cell 12.

Also positioned opposite cell 12 is a light detector 22 which may be a photometer, CCD or videcon camera, image dissection tube or the like, which is able to detect light emanating from the circuit 14 under test. Preferably, the detector 22 is also mounted to an XY positioning device 19 so that it can be moved relative to cell 12 and the circuit therein.

Cell 12 includes an electrically conductive bottom wall 26, which functions as an electrode, four non-conductive side walls 28 and a top wall or cover 32 which can be removed to gain access to the interior of the cell for positioning a circuit 14 therein. In the illustrated cell embodiment, cover 32 is hinged as at 34 to a side wall 28 so that the cover can be swung between open and closed positions. Appropriate seals or gaskets 36 may be provided all around the tops of side walls 28 so that when the cover 32 is in its closed position, a hermetic seal is provided between the cover and side walls 28. Also, a handle/latch 42 may be mounted to the top of cover 32 which can engage a detent 42a on the underlying side wall 28 to facilitate lifting the cover and locking the cover in its closed and sealed position.

Still referring to FIG. 1, the circuit 14 may be supported within cell 12 by ledges or brackets 44 projecting inwardly from the cell side walls 28 so that the circuit is supported in an image plane that is parallel to the bottom wall 26 and also parallel to the cover 32 when that cover is in its closed position. Suitable spring-loaded latches 45 may be positioned around the ledges to releasably lock the circuit in place. When seated thusly, circuit 14 is spaced more or less midway between bottom wall 26 and top wall 32, the spacing from each wall being in the order of 2 to 10 millimeters, 5 mm being optimum.

In accordance with this invention, the cell top wall or cover 32 is electrically conductive as well as transparent to the light emanating from laser 18. More particularly, that cover may include a rigid transparent glass layer 32a whose underside or inner surface is covered by a transparent, electrically conductive film or coating 32b of gold or other inert metal which functions as an electrode. As an alternative, a fine wire grid could also be used as the transparent electrode. Preferably also, an antireflective coating 32c is applied to the upper or outer surface of cover 32.

In order to make external electrical connections to the conductive bottom wall 26 of cell 12, an electrical contact or connector 52 may be mounted to a cell side wall 28, herein the righthand side wall shown in FIG. 1. A similar contact or connector 54 mounted to that same wall adjacent to the cover hinges 34 may be connected electrically, via a wire 56, to the conductive coating 32b of cover 32. In addition, a pair of gas fittings 56 and 58 may be mounted to that same side wall 28 preferably at diagonally opposite corners thereof so that gas can be circulated through the test cell. These fittings may include appropriate check valves to enable the gas to be introduced into the interior of the cell by way of fitting 56 and to be exhausted from the cell by way of fitting 58. But when there is no gas flow or when the cell is detached from the support 16 the valves in both of these fittings are preferably biased closed.

In a preferred embodiment of the invention, the cell 12 includes an interior pressure sensor 62 for sensing the gas pressure inside cell 12 and developing an output signal in response thereto. This signal may appear on an external contact or connector 64 mounted to the righthand side wall 28 of cell 12 so that the gas pressure inside the cell can be monitored by external means.

Still referring to FIG. 1, the support 16 may include a pair of parallel rails 16a for supporting the cell in a generally horizontal plane and a back wall 16b for supporting a variety of contacts and fittings which are adapted to be coupled to contacts and the fittings on cell 12 when the cell is positioned against wall 16b. Thus, as shown in FIG. 1, there may be an electrical contact or connector 52a that mates with on cell 12 and a second similar contact 54a for mating with the cell contact 54. Likewise, there may be a contact 64a appropriately positioned on wall 16b directly opposite the pressure sensor contact 64 on cell 12. Thus, when the cell is pressed tightly against the support wall 16b, all of the aforesaid corresponding contacts and fittings may be coupled together to connect the cell to the rest of apparatus 10. Appropriate latches (not shown) may be provided on rails 16a to lock the test cell in place during a test.

As seen in FIG. 1, the electrical contacts 52a and 54a on support wall 16b may be connected electrically by way of a two-way switch 72 to a source 74 of dc potential.

The gas fitting 56a may be connected by way of a controllable valve 76 to a source of inert gas such as argon or neon, for example. The gas fitting 58a may be connected to a gas drain or negative pressure source (not shown) for purging the cell of air.

The operation of laser 18, light detector 22, switch 72 and valve 76 may be controlled by a controller 82 which also controls the positioning devices 23 and 19 which position laser 18 and detector 22. Also, the pressure sensor contact 64a may be connected to the controller so that the controller can monitor the pressure in cell 12 and control valve 76 to maintain a selected gas pressure inside the cell. The results of each test may be displayed on a monitor 84.

To test the circuit 14 for opens and shorts, the circuit may be placed in cell 12 and positioned on the supporting ledges 44 inside the cell. After the cell cover 32 is closed and the handle/latch 42 moved to its locked position to seal the circuit inside the cell, the cell may be positioned on support 16 and slid into position against the support backwall 16b thereby connecting the various contacts and fittings on the cell to their mating counterparts on wall 16b. Next, controller 82 may be activated to initiate the test. First, the controller opens the valve 76 and activates the vacuum source (not shown) at pipe 58 so that the cell 12 is purged of air and filled with an inert gas, e.g. argon, at a selected relatively low pressure, e.g. 100 Torrs. The controller 82 may sample the output of the pressure sensor 62 in cell 12 and control valve 76 as needed to maintain the desired internal pressure.

In the event that it is desired to ready circuit 14 for testing ahead of time, the circuit can be loaded into cell 12 as described above, and the cell can then be connected by way of its fittings 56 and 58 to a separate gas source and drain to provide the proper inert atmosphere inside the cell. With that arrangement, a number of different circuit boards can be prepared ahead of time in different cells and loaded one after the other into apparatus 10. This increases testing efficiently and thus decreases board testing costs since the expensive portion of apparatus 10 is not tied up while the circuits are being prepared for testing. Moreover, in that event, the rest of apparatus 10 need not be kept under clean room conditions.

The actual testing of the circuit 14 may be performed by apparatus 10 in two phases, namely, a charge phase and a discharge phase. Referring to FIGS. 2A and 3A, first controller 82 positions laser 18 so that its beam of light can image a selected spot or point on a conductor 14a of circuit 14, e.g. spot P in FIG. 1. Then the controller controls switch 72 so as to apply a small potential difference, typically in the range of 1 to 5 volts, e.g. 2 volts, between the electrodes 26 and 32b, with electrode 32b carrying the negative charge as shown in FIG. 3A. Next, controller 82 activates laser 18 so that the laser emits a pulse of coherent light L, with the light beam being brought to a focus at a focal point FP inside cell 12 between the upper electrode 32b and the conductor 14a at spot P. The inert gas at the focus of the beam ionizes as a result of multiphoton absorption and, depending upon the gas pressure in cell 12, a cascading effect. As a result, a plasma forms quickly at the focal point FP and, under the influence of the applied electric field, diffuses to form a plasma "tube" T that electrically connects the conductor spot P and the electrode 32b. Upon formation of the tube T, a current flows briefly to the conductor spot P thus imparting an electric charge to that spot and to all of the conductor portions or runs having electrical continuity with that spot on the conductor 14a. On the other hand, conductor runs separated from spot P by a break or crack B receive no charge. One such isolated run is shown in FIG. 2A to the left of break B in a conductor 14a.

A few microseconds after the laser pulse has ended, the plasma tube dissipates and the conductor charging ceases. The energy per laser pulse required for plasma formation is dependent upon the gas used in cell 12, the pressure of that gas, the wavelength of the light emitted from laser 18 and the cross section of the laser beam at the focal point FP. As an example, a laser operating at a wavelength of one micron with a pulse length of twenty nanoseconds and a laser beam focal spot 5 mils in diameter in an argon atmosphere at 100 Torrs requires an energy of about one joule per pulse per plasma formation.

After the circuit conductor 14a has been charged at point P as aforesaid, the apparatus 10 may be switched immediately to its discharge mode of operation. More particularly, controller 82 may switch switch 72 so that a relatively high voltage of the opposite polarity is applied to electrodes 26 and 32b. As shown in FIG. 3B, this voltage should exceed the breakdown voltage of the gas in cell 12, e.g. 200 volts for argon gas, and have a shaped waveform to control the discharge from conductors 14a. Once the breakdown voltage of the cell gas is reached, electrons are emitted from the previously charged conductors 14a as shown by the small vertical arrows in FIG. 2B. These electrons excite the gas around the charged conductors creating a glowing discharge plasma G, shown in FIG. 2B, along all of the runs and branches of the conductors 14a that were previously charged and therefore connected electrically, by desire or due to shorts, to the conductor spot P imaged by the laser beam during the charge phase of the test. On the other hand, those runs or portions of the conductors 14a that did not have electrical continuity with conductor spot P because of a break or crack B and therefore were not so charged are not "tagged" or identified by the glowing plasma discharge G. One such non-glowing conductor run is shown in FIG. 2B to the left of break B.

Simultaneous with the application of the high voltage field, controller 82 may control detector 22 so that the detector scans the circuit and samples the light emanating from selected points on the circuit to produce an electronic "map" which indicates which of the sampled points glow and which do not. This information can then be compared with a reference map stored in the detector or in the controller 82 to identify the sites of unwanted open circuits and/or short circuits in the circuit 14. The test results can then be displayed in any desirable format on the monitor 84. Instrumentation for accomplishing this is disclosed, for example, in the above-identified U.S. Pat. No. 4,507,605.

Instead of scanning circuit board 14 to find faults, a camera may be used to take a snapshot of circuit 14 from above or, in some cases, an operator can find a fault on the board simply by observing which segments of the circuit glow and which do not.

It will be seen from the foregoing that apparatus 10 enables the testing for opens and shorts of printed wiring boards, circuits and the like in a manner that requires no physical contact with the board or circuit and which, therefore, minimizes or substantially eliminates the potential for damage to those circuits due to the tests.

In addition, the test cell 12 illustrated herein produces substantial logistical benefits. First, cell 12 enables the circuit under test to be isolated in the test cell thus giving the option of having the apparatus as a whole located outside expensive and sometimes limited clean room facilities. Secondly, since the test cell 12 is relatively simple and inexpensive to make, several can be kept on hand so that while one circuit board is being tested in one cell, other boards can be loaded into other cells and prepared for testing. This increases the efficiency of the testing process and decreases testing costs since the expensive parts of apparatus 10, i.e. laser 18, detector 22, controller 22 and monitor 84 will not be tied up while circuits are being loaded into cells 12 and the cells filled with inert gas as described above.

Certain changes may be made in the above construction without departing from the scope of the invention. For example, for two-sided testing applications, the cell 12 bottom wall 26, instead of being a metal plate, can be made identical to the top wall or cover 32 and an additional laser and detector can be mounted in relation to the bottom wall 26 in the same manner that laser 18 and detector 22 are mounted in relation to top wall 32. Furthermore, the power plane of circuit board 14 under test may then be utilized as an electrode. Therefore, it is intended that all matter contained in the above description or shown in the accompanying drawings shall be interpreted as illustrative and not in a limiting sense.

It should also be understood that the following claims are intended to cover all of the generic and specific features of the invention herein described.

We claim:

1. A test cell for non-contact testing a circuit having one or more conductors for unwanted opens and shorts, said cell comprising a hermetically sealable container for a circuit, said container having top and bottom walls and side walls which support said top and bottom walls in spaced apart relation, at least one of said walls providing access to permit a circuit to be inserted into and withdrawn from the container;

means inside the container for locating an inserted circuit at an imaging plane in the container between said top and bottom walls;

a pair of planar electrodes positioned in the container, said electrodes being spaced on opposite sides of and substantially parallel to the imaging plane;

a pair of connectors connected electrically to said pair of electrodes and extending to the exterior of the container for detachably connecting the electrodes to a source of dc potential outside the container to produce an electric field between the electrodes extending generally perpendicular to the imaging plane, at least one of said top and bottom walls and the electrode adjacent thereto being substantially transparent to light from a laser positioned outside the container and for imaging the conductors of a circuit positioned at said imaging plane;

a source of inert ionizable gas capable of forming a plasma when exposed to an electric field exceeding the breakdown voltage of the gas, and gas fill means in the form a valved gas fitting mounted to the exterior of the container and communicating with the interior thereof for detachably connecting the container interior to said gas source so that said gas fills the container and is ionized by the electric field produced when a selected voltage is applied to said connectors during a test, said container being totally devoid of parts for contacting the conductors of the circuit being tested in the container.

2. The test cell defined in claim 1 and further including means in the container for sensing the gas pressure inside the container.

3. The test cell defined in claim 1 wherein said fill means also include a second valved gas fitting mounted to the exterior of the container and communicating with the interior of the container for detatchably coupling the container to a gas drain.

4. The test cell defined in claim 1 wherein the electrode adjacent to said at least one of said top and bottom walls comprises a thin electrically conductive film coated onto the interior surface of that wall.

5. The test cell defined in claim 1 wherein said pair of electrodes comprise thin electrically conductive films coated onto the interior surfaces of said top and bottom walls.

6. The test cell defined in claim 5 wherein said films are of a relatively inert metal.

7. The test cell defined in claim 1 wherein said pair of electrodes comprises arrays of fine wires extending over the interior surfaces of said top and bottom walls.

8. The test cell defined in claim 1 wherein the electrode adjacent to said at least one of said top and bottom walls comprises an array of fine wires extending over the interior surface of that wall.

9. The test cell defined in claim 1 wherein the spacing between the imaging plane and each electrode is in the order of 2 to 10 millimeters.

10. A test cell as defined in claim 1 wherein said connecting means and said fill means are located in the same wall of the container.

11. A test cell for non-contact testing a circuit having one or more conductors for unwanted opens and shorts, said cell comprising a hermetically sealable container for a circuit, said container having planar top and bottom walls and side walls which support said top and bottom walls in spaced-apart relation, at least one of said walls providing access to permit a circuit to be inserted into and withdrawn from the container;

means inside the container for locating an inserted circuit at an imaging plane in the container between said top and bottom walls;

a pair of planar electrodes positioned in the container, said electrodes being spaced on opposite sides of and substantially parallel to the imaging plane, at least one of said top and bottom walls and the electrode adjacent thereto being substantially transparent to light from a laser positioned outside the container and for imaging the conductors of a circuit board positioned at said imaging plane;

a source of inert ionizable gas capable of forming a plasma when exposed to an electric field exceeding the breakdown voltage of the gas;

fill means mounted to the exterior of the container and communicating with the interior thereof for detachably connecting the container interior to said gas source so that said gas can fill the container;

connecting means connected electrically to said pair of electrodes and extending to the exterior of the container;

a voltage source for coupling to said connecting means to apply a selected voltage to the electrodes to produce an electric field generally perpendicular to said imaging plane that ionizes the gas in said container;

a laser whose beam is brought to a focus between a said transparent electrode and a selected spot on a conductor of a circuit in said imaging plane so as to excite the chamber gas at the beam focus to form a plasma which conducts electric charge to said selected conductor spot and other conductor portions in continuity with said spot;

means for applying to said electrodes via said connectors a voltage of opposite polarity and of a magnitude sufficient to form a glowing discharge plasma in the chamber gas opposite the charged portions of the conductors of the circuit in said imaging plane, and means for determining which conductor portions are glowing and thus in electrical continuity with said selected conductor spot and which portions are not.

* * * * *